(12) United States Patent
Avouris et al.

(10) Patent No.: US 6,423,583 B1
(45) Date of Patent: Jul. 23, 2002

(54) METHODOLOGY FOR ELECTRICALLY INDUCED SELECTIVE BREAKDOWN OF NANOTUBES

(75) Inventors: Phaedon Avouris, Yorktown Heights; Philip G. Collins, Ossining; Richard Martel, Peekskill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/753,845

(22) Filed: Jan. 3, 2001

(51) Int. Cl.$^7$ ............................................... H01L 21/00
(52) U.S. Cl. ...................... 438/132; 438/142; 438/151
(58) Field of Search ................................. 438/128, 131, 438/132, 142, 149, 151, 800

(56) References Cited

U.S. PATENT DOCUMENTS

2001/0001681 A1 * 5/2001 Zhang et al. ................ 427/508
2001/0023986 A1 * 9/2001 Mancevski ................... 257/741
2002/0004136 A1 * 1/2002 Gao et al. .................... 428/367

OTHER PUBLICATIONS

Meyyappan & Shrivastava, "Carbon Nanotubes", Aug.–Sep. 2000, IEEE Potentials, vol. 19, Issue 3, pp. 16–18.*

Anantram, "Transport through carbon nanotube wires", May 2000, 7th Annual Workshop on Computational Electronics, book of abstracts, pp. 43–44.*

Johnson, "Electronics of Single–Wall Carbon Nanotubes", Feb. 1999, Solid–State Circuits Conference, Digest of Technical Papers, pp. 210–211.*

Nishijima et al., "Novel process for fabricating nanodevices consisting of carbon nanotubes", Jul. 1999, Microprocesses and Nanotechnology Conference, Digest of Papers, pp. 42–43.*

Iijima, "Carbon Nanotubes and Their Recent Developments", Jan. 1998, Micro Electro Mechanical Systems, Proceedings of The 11th Annual International Workshop on, pp. 520–525.*

* cited by examiner

Primary Examiner—Michael J. Sherry
Assistant Examiner—Evan Pert
(74) Attorney, Agent, or Firm—F. Chau & Associates, LLP

(57) ABSTRACT

A method is provided for forming a device. The method provides an insulating substrate including a source electrode, a drain electrode, and a gate electrode. The method provides carbon nanotube bundles including metallic and semiconducting component nanotubes in contact with the substrate. The method applies a voltage to the gate electrode to deplete the semiconducting component nanotubes of carriers, applies an electrical current through the nanotube, from a source electrode to a drain electrode, and breaks at least one metallic component nanotube to form a field effect transistor. The carbon nanotube bundle can be a multi-walled nanotube or a single-walled nanotube rope.

25 Claims, 7 Drawing Sheets

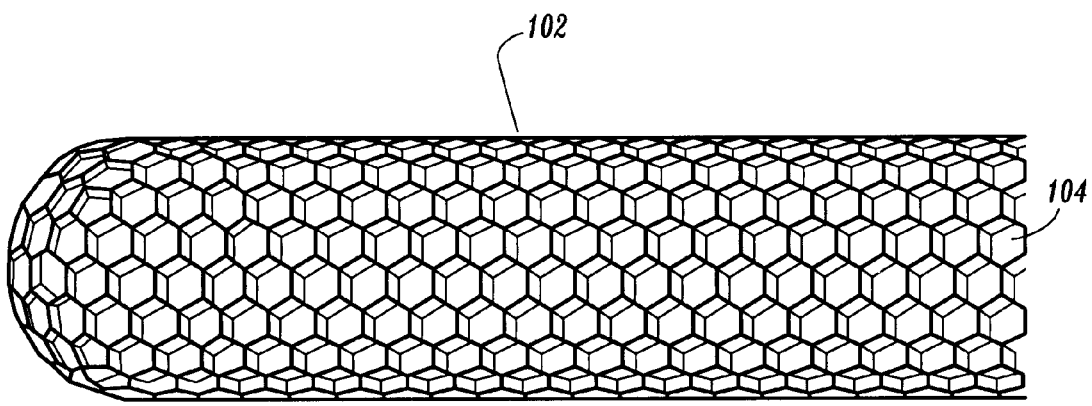
FIG. 1A
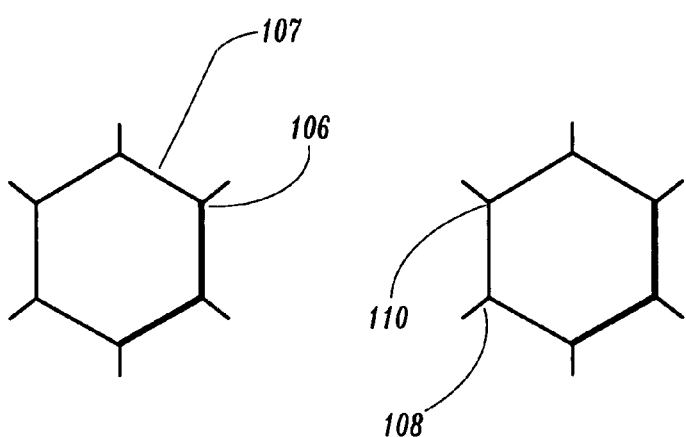
FIG. 1B    FIG. 1C

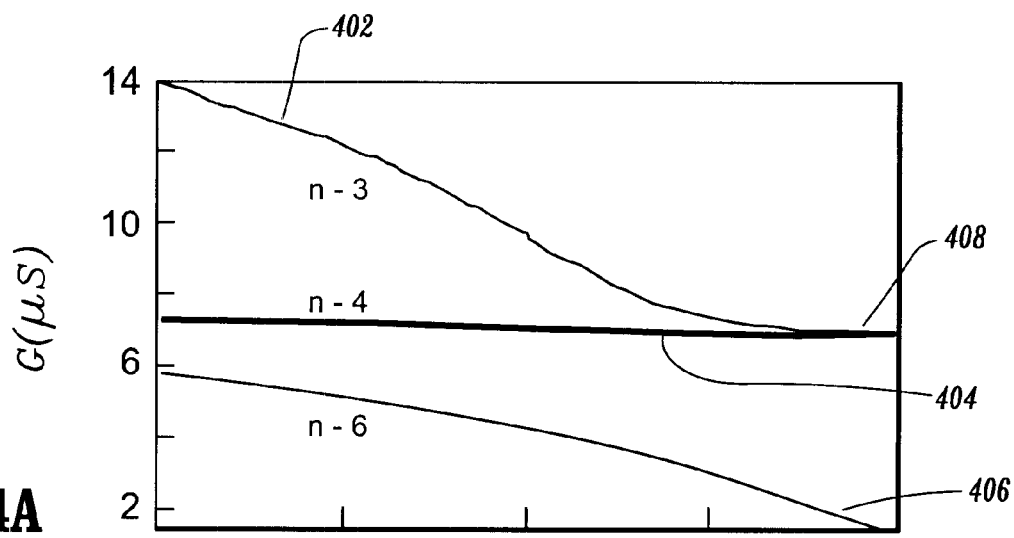
FIG. 4A
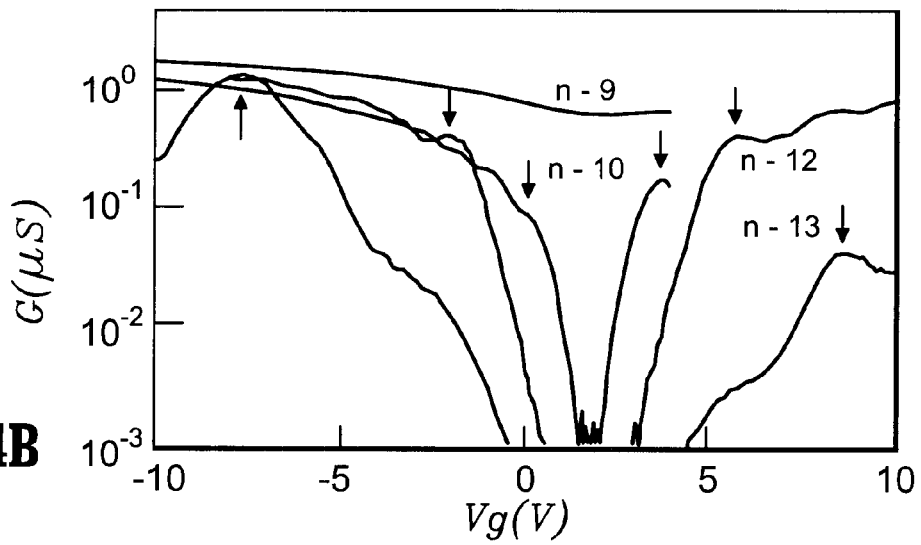
FIG. 4B
| Shell # | Diameter nm | Relative Bandgap | |
|---|---|---|---|
| | | calculated | measured |
| $n$ | 9.5 | | |
| $n$-10 | 2.7 | 0.24 | 0.22 |
| $n$-11 | 2.0 | 0.33 | |
| $n$-12 | 1.3 | 0.49 | 0.48 |
| $n$-13 | 0.7 | 1.00 | 1.00 |
FIG. 4C

METHODOLOGY FOR ELECTRICALLY INDUCED SELECTIVE BREAKDOWN OF NANOTUBES

BACKGROUND OF THE INVENTION

1. Field of the Invention

The present invention relates to nanostructures, and more particularly to a system and method of electrically induced breakdown of nanotube nanostructures.

2. Description of Related Art

In the field of molecular nanoelectronics, few materials show as much promise as nanotubes, and in particular carbon nanotubes, which comprise hollow cylinders of graphite, angstroms in diameter. Nanotubes can be made into tiny electronic devices such as diodes and transistors, depending on the nanotube's electrical characteristics. Nanotubes are unique for their size, shape, and physical properties. Structurally a carbon nanotube resembles a hexagonal lattice of carbon rolled into a cylinder.

Besides exhibiting intriguing quantum behaviors at low temperature, carbon nanotubes exhibit at least two important characteristics: a nanotube can be either metallic or semiconductor depending on its chirality (i.e., conformational geometry). Metallic nanotubes can carry extremely large current densities with constant resistivity. Semiconducting nanotubes can be electrically switched on and off as field-effect transistors (FETs). The two types may be covalently joined (sharing electrons). These characteristics point to nanotubes as excellent materials for making nanometer-sized semiconductor circuits.

Current methods of studying nanotubes rely on the random formation of both metallic and semiconducting nanotubes. There is no known method for reliably preparing a nanotube having particular characteristics, much less for preparing nanotubes to exhibit junctional behavior such as transistors, diodes, etc. Nor are there known methods of nanotube separation by selective synthesis or post-synthesis which have proven to have any measurable level of success. Heretofore, nanotubes must have either been individually separated from mixtures of metallic and semiconducting nanotubes or randomly placed over an electrode to be studied. However, there is no observable consistency in such methods.

This lack of control, compounded by nanotubes' tendency to bundle together, has hindered the study of nanotube physics and is seen as a primary roadblock in the nanotube development including nanotube-based electronic technology. Therefore, a need exists for a system and method of preparing nanotubes having desired characteristics.

SUMMARY OF THE INVENTION

The present invention relates to a method for forming a device comprising the steps of, providing a substrate, providing nanotubes in contact with the substrate, and selectively breaking a nanotube using an electrical current. The method further includes the step of depleting a semiconducting nanotube of carriers.

Depleting a semiconducting nanotube of carriers further includes the step of applying a voltage to a gate electrode. The method includes applying the electrical current through the nanotube from a source electrode to a drain electrode.

The nanotubes include multi-walled nanotubes including metallic and semiconducting nanotubes. The nanotube can have an outer metallic nanotube that is broken.

The nanotubes include single-walled nanotube ropes including metallic and semiconducting nanotubes. At least one metallic nanotube is broken.

The nanotubes are provided at a density between a monolayer and about ¹⁄₁₀th of one percent coverage. The substrate is an insulator and includes an array of metallic pads. The substrate is silica based and includes the array of metallic pads. Each pad includes one of a source electrode, a drain electrode, and a gate electrode.

Providing a substrate is accomplished using lithography to form an array of pads, each pad including a corresponding electrode, on an insulating substrate.

The nanotubes are carbon nanotubes. The method also breaks stray nanotubes.

According to an embodiment of the present invention, a method of modifying at least one characteristic of a nanotube is provided. The method includes providing a mixture of nanotubes, and applying a current to the mixture, inducing the selective breakdown of the nanotube mixture. The method further includes removing carriers from a semiconducting nanotube.

The current selectively breaks metallic nanotubes. A power applied to the mixture is about 500 $\mu$W.

The nanotube is one of a multi-walled nanotube and a single-walled nanotube rope. The characteristic is one of diameter, density, and conductance. The mixture includes metallic and semiconducting nanotubes. The current density is greater than $10^9$ A/cm².

According to an embodiment of the present invention, a method is provided for forming a device. The method provides an insulating substrate including a source electrode, a drain electrode, and a gate electrode. The method provides carbon nanotube bundles including metallic and semiconducting component nanotubes in contact with the substrate, wherein the nanotubes are provided at a density of about one percent coverage. The method applies a voltage to the gate electrode to deplete the semiconducting component nanotubes of carriers, applies an electrical current through the nanotube, from a source electrode to a drain electrode, and breaks at least one metallic component nanotube to form a field effect transistor. The carbon nanotube bundle can be a multi-walled nanotube or a single-walled nanotube rope.

BRIEF DESCRIPTION OF THE DRAWINGS

Preferred embodiments of the present invention will be described below in more detail, with reference to the accompanying drawings:

FIGS. 1a, 1b, and 1c are diagrams of a nanotube and constituent hexagonal rings;

FIG. 4a is a graph showing the low bias conductance alternatives between semiconducting and metallic behaviors due to the charging nature of the outermost shell of a multi-walled nanotube at each stage of breakdown;

FIG. 4b is a graph showing the conductance of the remaining semiconducting shells after the last metallic shell has been removed from a multi-walled nanotube;

FIG. 4c is a table showing the relationship between shell number, diameter, and the relative band gap energy;

DETAILED DESCRIPTION OF PREFERRED EMBODIMENTS

According to the present invention a method of permanently modifying a multi-walled nanotube (MWNT) or a single-walled nanotube (SWNT) rope or bundle is provided. A nanotube can be metallic or semiconductor depending on its chirality (i.e., conformational geometry). Both species are found in MWNTs and SWNTs. A method according to the present invention uses current-induced electrical breakdown to eliminate individual nanotubes having a particular characteristic. The method is able to tailor the properties of a composite nanotube by changing the proportion of component nanotubes. It should be noted that while the present invention is described using carbon based nanotubes, the illustrative methods are applicable to any molecular structure in which a current can be applied selectively to particular surface areas. For example, the present invention can also be used in Boron-Nitride (BN) and metal dichalcogenids ($MX_2$) based nanostructures.

Carbon nanotubes can withstand current densities exceeding $10^9$ A/cm$^2$, in part due to the strength of carbon-to-carbon bonds (e.g., the bond strength for a single C—C bond is about 347 kJ/mol). Ultimately however, at high enough currents, nanotubes will fail. For example, for a MWNT, failure occurs in air at a certain threshold power, e.g., approximately 500 $\mu$W, above which the rapid oxidation of the outermost carbon shell is initiated. Remember that power is equal to current times the potential difference (i.e., voltage). Because heat induced oxidation of defect-free graphite only proceeds at extremely high temperatures, e.g., >2000° C., the primary factor in the breakdown initiation according to the present invention is current-induced defect formation, with self-heating being a secondary effect.

Referring to FIG. 1a, a nanotube 102 includes a hexagonal lattice of carbon or other molecules. In the case of carbon, a ring 104 can be built including six carbons covalently bonded to one another. FIG. 1b shows an individual carbon ring, each intersection 106 indicates an individual carbon atom, bonds are also indicated as 107. An alternative structure is a boron-nitride ring, one form is shown in FIG. 1c. The boron-nitride ring may includes three boron atoms, e.g., 110, bonded to three nitrogen atoms, e.g., 108, in an alternating pattern.

Figure 2A:
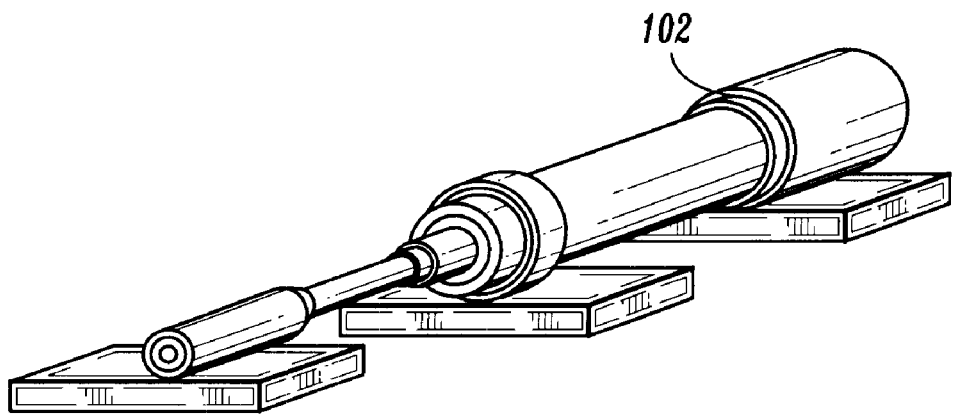
FIG. 2a is a diagram showing a multi-walled nanotube and FIG. 2b shows a single-walled nanotube rope.
Figure 2B:
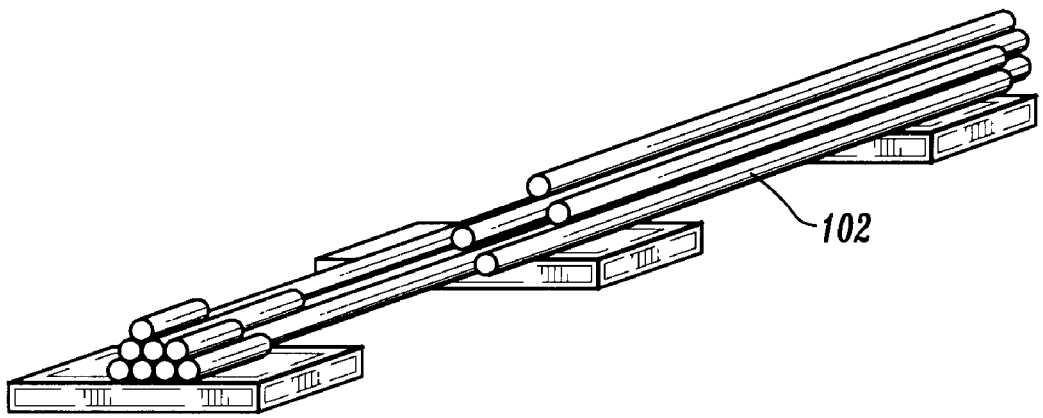

By taking advantage of the current-induced defect formation, a method according to the present invention selectively breaks current-carrying nanotubes without affecting parallel nanotubes in cases where the parallel nanotubes carry little or no current. For example, MWNTs as shown in FIG. 2a, favor the outermost shell 102 because it is in direct contact with external electrodes (e.g., a source and a drain). This distribution can leave the innermost shells carrying little or no current, which protects them during current-induced oxidation. In a SWNT rope, shown in FIG. 2b, individual nanotubes (e.g., 102) are arranged in parallel. The distribution of current through a SWNT rope is more uniform than through a MWNT because the individual nanotubes of a SWNT rope can be simultaneously in good contact with the external electrodes.

Generally there is no reason for a current to favor some SWNTs over others, however, according to an embodiment of the present invention, an electrostatically coupled gate electrode can selectively deplete the component semiconducting nanotubes of their carriers. In other words, for a SWNT or MWNT which spans a source electrode and a drain electrode, by applying a voltage to a corresponding gate electrode, carriers can be depleted from the component semiconducting nanotubes. Once depleted, the semiconducting nanotubes are protected from damage, and high current densities applied to the SWNT or MWNT by the source electrode can be used to initiate oxidation of the component metallic nanotubes. Thus, these methods can protect semiconducting nanotubes within a SWNT rope as well as an outer semiconducting MWNT shell.

The removal of carbon nanotubes from these composite conductors can be observed both electrically and through microscopy. Electrically, the breakdown of a single carbon nanotube results in a partial conductance drop, typically completed in a few milliseconds. When stressed at sufficiently high bias, multiple independent drops occur as one carbon shell after another is broken. The electronics used in the breakdown are capable of controlling the number of nanotubes broken. Upon sensing a drop in current, e.g., about 19 $\mu$A, the electronics are able to stop the breakdown process, thereby controlling the exhibited characteristics.

Figure 3:
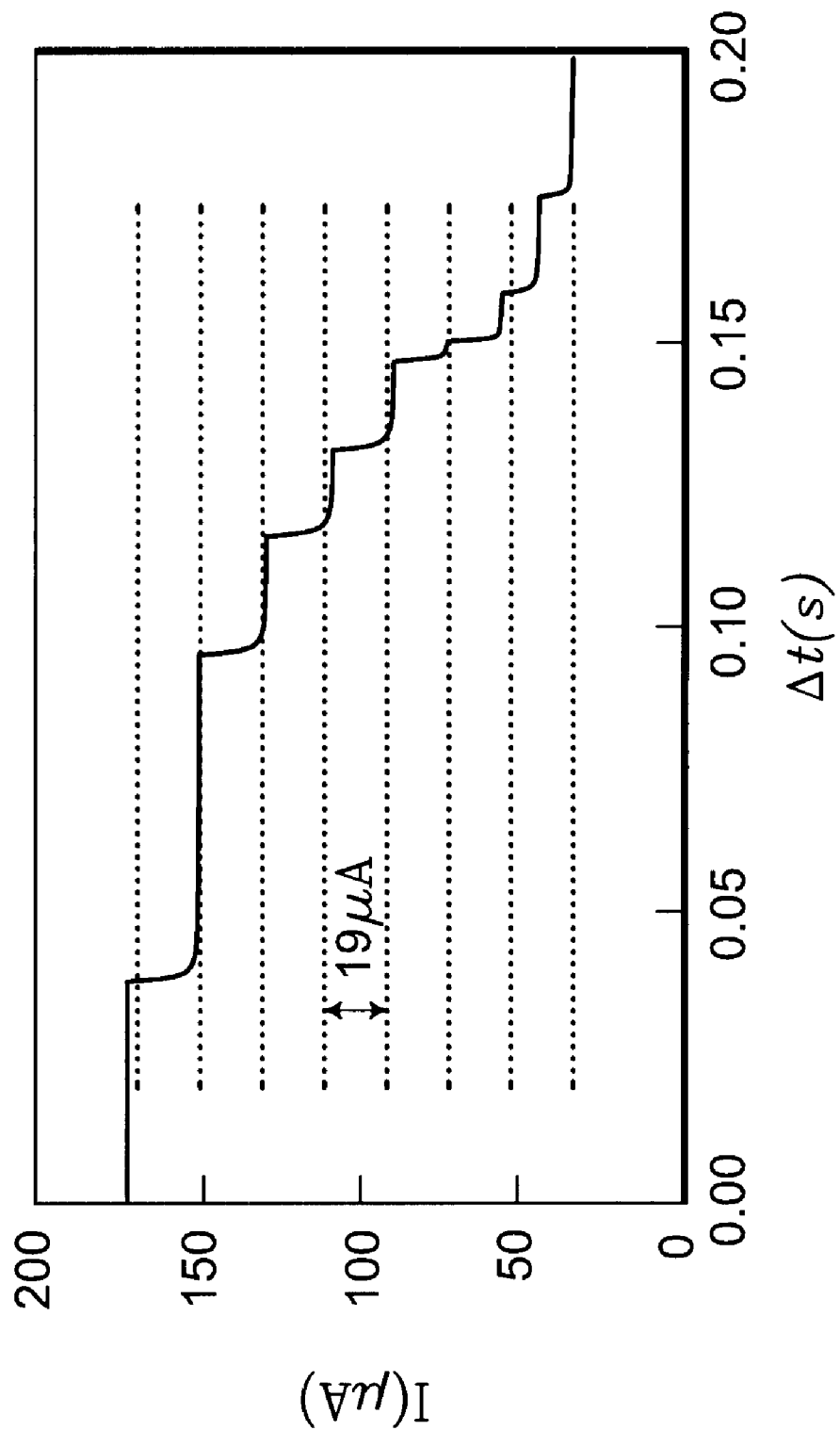
FIG. 3 is a graph of the partial electrical breakdown of a multi-walled nanotube at constant voltage over time.

Referring to FIG. 3, the partial electrical breakdown of a MWNT at constant voltage stress proceeds in a series of discrete steps corresponding to the loss of eight individual layers of the MWNT. These results were obtained at a power of about 450 $\mu$W, and a potential difference of about 2 volts. The regular breakdown in current of about 19 $\mu$A per shell can also be seen in FIG. 5. A decrease in radius of a partially broken MWNT is equal to the intershell spacing (0.34 nm) times the number of completed breakdown steps. A similar thinning can be accomplished with a SWNT bundle with metallic SWNTs being selectively broken leaving only the semiconducting SWNTs.

The breakdown is aided by the sensitivity of nanotubes to external stresses, since relatively small electric fields and currents can affect individual molecules. For example, a semiconducting nanotube 1 nm in diameter can be electrostatically depleted of electrical carriers by a gate electrode hundreds of nanometers away. The current density (sufficient to affect nanotube breakdown) acts as a catalyst, initiating a chemical reaction between the nanotube and surrounding gasses. For example, for a carbon nanotube in air, the reaction can be written as: C (nanotube)+$O_2$(gas) →$CO_2$(gas).

The present invention also contemplates other environments, wherein nondestructive current-assisted reactions can chemically modify particular nanotubes. The resulting devices could incorporate both electrical switching and chemical sensitivity. For example, using a nanotube's sensitivity to various gases, chemical modification can be used in the context of a chemical nanosensor, where a change in the conductivity of a nanosensor (nanotube) signals the presence of a particular gas.

On a practical level, the controlled destruction of nanotubes allows for the separation of semiconducting SWNTs from mixtures of SWNTs (including metallic and semiconducting SWNTs) and the preparation of nanotube-based field effect transistors (FETs). It should also be noted that, the methods disclosed herein can be used to prepare transistors (e.g., a FET), diodes, and resistors, depending on the characteristics of the nanotubes and the design of the substrate.

More fundamentally, the process can facilitate the study of the complex electronic structures and transport properties of MWNTs and SWNT ropes. By removing the stress (current) at the occurrence of individual conductance steps, these composite nanowires may be re-characterized upon the loss of each constituent conductor (nanotube). Characterization refers to, for example, the conductance properties of a MWNT or SWNT rope from one stage in the breakdown process to another. Multiple complementary transport measurements can, for example, probe deeper and deeper into the inner shells of a MWNT, allowing for the characterization, as well as a direct comparison, of transports through each shell.

The different shells of a MWNT are presumed to alternate in a random fashion between metallic and semiconducting. This can be directly tested by using controlled breakdown followed by low bias or low temperature measurements, which probe the outermost shell of a MWNT. Following previous measurements on SWNTs, the semiconducting and metallic shells can be differentiated by measuring the conductance G as a function of gate voltage Vg using a relatively small, 10 mV source-drain bias. A metallic shell is characterized by a G which is independent of Vg, or nearly so, whereas a semiconducting shell can be electrostatically depleted of carriers by the gate.

Referring to FIGS. 4a through 4c, by halting the stress upon each breakdown event, a MWNT may be characterized after the loss of each constituent shell. FIG. 4a shows the low bias conductance (G(Vg)) alternates between semiconducting (e.g., 402 and 406) and metallic (e.g., 404) behaviors due to the changing nature of the outermost shell at each stage of breakdown. In FIG. 4b, when the last metallic shell (n-9) has been removed, the remaining semiconducting shells can be completely depleted to give regions of zero conductance. Taking the indicated peaks in G(Vg) to correspond to conductance and valence band edges, the band gaps of different shells can be determined within a constant or proportionality. The relative widths agree with calculations based on the expected diameter dependence as shown in FIG. 4c, in which the only parameters are the initial diameter of the tube and the 0.34 nm spacing between adjacent shells.

FIGS. 4a and 4b show the room temperature G(Vg) for various different layers within a MWNT. Initially, the MWNT has a diameter of 9.5 nm, n shells, and a metallic G(Vg). FIG. 4a shows the strong modulation in G(Vg) observed after removing three shells 402. Removing a fourth layer results in a metallic G(Vg) 404, and removing the sixth shell produces another semiconducting G(Vg) 406. This variation is interpreted as a signature of the alternating character of the carbon shells being removed.

The fact that G does not fall to zero for a particular semiconducting shell is due to the contribution of inner metallic shells which continue to conduct. Shells n-3 and n-4 demonstrate this: the depletion minimum of the G(Vg) curve for shell n-3 coincides with the conductance of the underlying shell n-4 408. In this case, the outer, semiconducting shell n-3 can be fully depleted by the gate, but the measured conductance includes leakage through the underlying metallic shell. Additional measurements show that this leakage is energetically frozen out in the low temperature, the low bias limit indicating that the intershell coupling is thermally activated. The gradual thinning of MWNTs and SWNT ropes can be resolved using, for example, atomic force and scanning electron microscopy with a linear correspondence between the number of breakdown steps and change in apparent diameter.

Upon removing the tenth carbon shell, the MWNT begins to behave like a perfect, intrinsic field-effect transistor (FET), with a region of zero conductance even at room temperature due to the complete depletion of carriers (e.g., FIG. 4b). Similar characteristics are found for individual semiconducting SWNTs, though the SWNTs used were strongly p-type and did not have symmetric G(Vg) characteristics. The complete depletion of the MWNT indicates that no metallic shells remain, and this behavior persists until the fourteenth carbon shell is removed, at which time the MWNT circuit opens. Based on the known intershell spacing of nearly 0.34 nm, a MWNT of this diameter can have at most fourteen shells, in agreement with the shell-by-shell count.

FIG. 4b shows the gradual increase of the zero conductance region as the final semiconducting shells are removed. The width of this region is proportional to the band gap (the energy needed to break a bond) of the semiconductors, with conduction above and below the gap due to electron-like and hole-like carriers, respectively. Due to the use of high voltage pulses to break shells, some rearrangement of trapped charges occurs on an underlying $SiO_2$ substrate. To simplify the comparison among shells, the curve shown in FIG. 4b is centered near Vg=0. A characteristic of semiconducting carbon nanotubes is that the band gap energy is inversely proportional to diameter, so that progressively smaller carbon shells exhibit larger band gaps, the width of the band gap determining the type of material (conductor, semiconductor, insulator). Using only the initial MWNT diameter and the intershell spacing, the expected ratios between band gap of the innermost shells can be calculated. As shown in FIG. 4c, these ratios agree with the experimental ratios, as defined by the conductance peaks on either side of the conductance gap and indicated in FIG. 4c.

Figure 5:
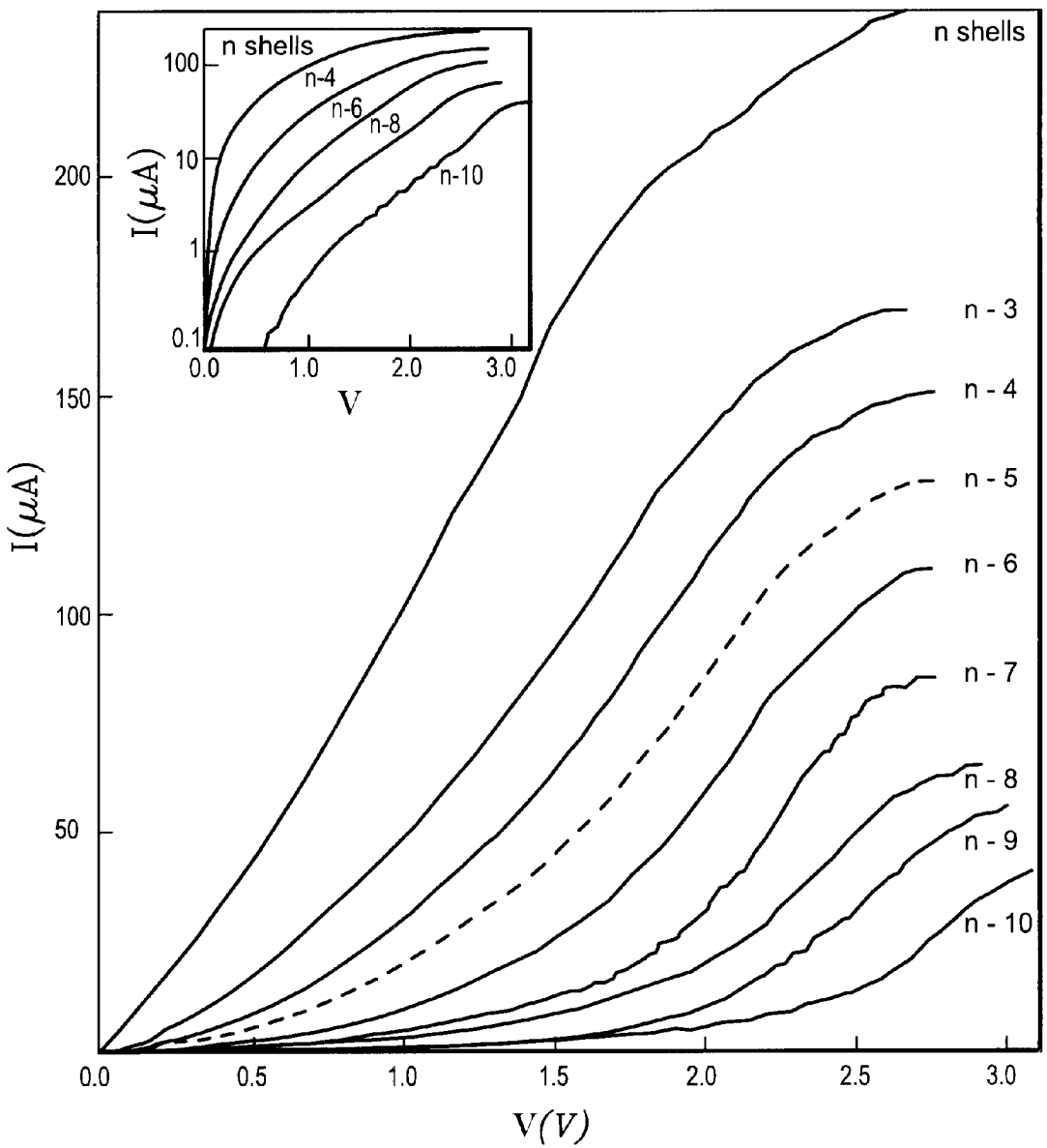
FIG. 5 is a graph showing the current (I) versus voltage for each shell of a multi-walled nanotube.

Referring now to FIG. 5, by recharacterizing the MWNT after the loss of individual shells, the contribution of each shell to the I-V can be determined. Based on the uniform spacing of the sequence of I-Vs, each shell saturates at the same current, and that all shells contribute to conduction at moderate and high bias. The dashed line indicates the position of an I-V which was not acquired. A semilog plot of selected I-Vs indicates a tendency towards exponential I-Vs for the innermost shells due to the effective barrier between them and the external electrodes. Similar barriers likely play a role in all shells except the outermost one, and explain the nonlinearities observed in some MWNTs but not others.

FIG. 5 shows a sequence of high bias current-voltage characteristics (I-Vs), effectively re-characterizing the MWNT with n, n-1, n-2, etc. shells, until only a single shell remains. High bias I-Vs must be acquired in high vacuum, e.g., <1 millibar or in an inert environment, to suppress destructive oxidation. Between each curve, the MWNT was exposed to air in order to controllably remove single carbon shells. Four-probe and two-probe measurements were periodically compared to monitor the contact resistance (Rc) to each nanotube. The data shown here are for samples exhibiting constant Rc of a few kOhms throughout the series of measurements. Samples with high Rc tend to fail at the contact, as opposed to the shell-by-shell mechanism described herein. Each I-V shows current saturation at a steadily increasing bias, similar to that observed in individual SWNTs, but at much higher currents. The removal of each shell from the MWNT appears to decrease this saturation level by a fixed amount of approximately 20 $\mu$A, in agreement with FIG. 3. This step-by-step decrease clearly indicates a high bias, that all of the MWNT shells contribute to transport and saturate equally.

Besides the decrease of the current saturation value, the sequence of I-Vs in FIG. 5 also exhibits increasing nonlinearity as shells are removed. A semilog plot of selected I-Vs shows the trend from a linear I-V towards an exponential characteristic of the form I=A exp(V/V$_o$), with V$_o$=0.50 V. Apparently, a tunneling barrier dominates the I-V of the innermost shells, most likely because these shells can only couple to the external electrodes through a barrier composed of many graphitic layers. For intermediate shells, not in direct contact with the electrodes, the unusual shape of the measured I-Vs can be understood qualitatively as due to a depth-dependent barrier in series with a nanotube's intrinsic, longitudinal I-V characteristic. This series barrier explains the gradual increase of the bias required to reach current saturation shown in FIG. 5. Furthermore, the transition from linear to nonlinear I-Vs observed here, and the abundance of similar nonlinear I-Vs reported in the literature suggests that transport experiments often do not directly contact the current-carrying carbon shell of a MWNT, but rather contact the partial or incomplete shells typically observed by transmission electron microscopy.

FIGS. 4a through 4c and 5 confirm the varying nature of MWNT shells, quantitatively address the coupling between these shells, and attempt to isolate the contribution of a single shell to the overall conductance. Until now, theory and experiment have been divided over these issues. On one hand, MWNTs are too complex to realistically model theoretically, and on the other hand no experiments have been able to directly probe the inner carbon shells. The powerful technique of controlled breakdown introduced here has the potential to provide new insights into the transport properties of these complex conductors. In addition, a MWNT can be selectively converted between metal and semiconductors with different band gaps.

The methods described for MWNTs can be applied to SWNT ropes. Although both MWNTs and SWNTs are composite nanotubes, SWNTs exhibit some differences. For example, multiple SWNTs within a rope can be in contact with their potentially oxidizing environment, allowing the simultaneous failure of many carbon shells rather than the uniform, shell-by-shell failure observed in a MWNT (e.g., FIG. 3). In addition, the SWNTs within a rope do not electrostatically shield each other as effectively as the shells of a MWNT. As a result, the breakdown in a rope can be directed solely at the metallic SWNTs by depleting the semiconducting SWNTs of carriers (in this case, Vg is held at +10 V during the stress to deplete the predominantly p-type SWNTs of carriers). Carrier densities in carbon based SWNTs can range from about 100 to about 1000 electrons/$\mu$m. Another difference is that each SWNT in a small rope connects independently to the external electrodes. Thus, more so than for a MWNT, a rope may be modeled as independent, parallel conductors with total conductance G(Vg)=G$_m$+G$_s$(Vg), where G$_m$ is the contribution of the metallic nanotubes and G$_s$ is the gate-dependent conductance of the semiconducting nanotubes.

Figure 6A:
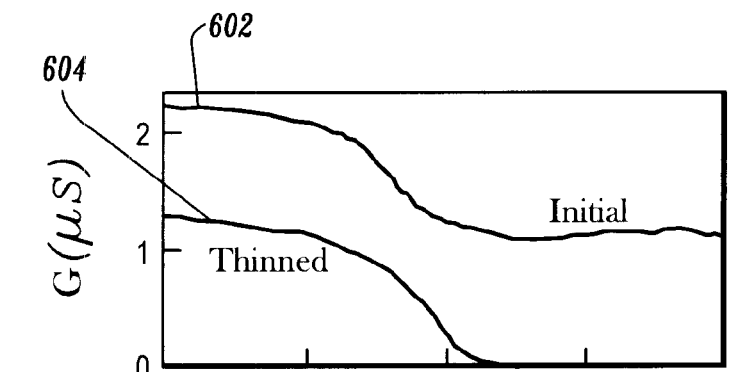
FIGS. 6a through 6d show several conversions of random mixtures of molecular conductors (nanotubes) into semiconducting field effect transistors.
Figure 6B:
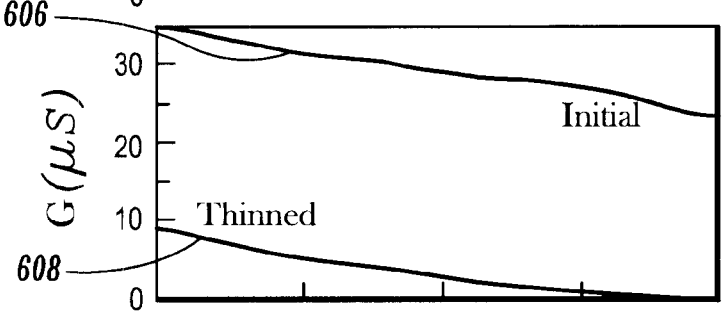

Referring to FIGS. 6a and 6b, by stressing a SWNT rope including a mixture of semiconducting and metallic SWNTs while simultaneously gating the bundle, the semiconductors are depleted of carriers in the selective breakdown of the metallic SWNTs. The initial SWNT bundles 602 and 606 include both metallic and semiconducting SWNTs, while the thinned SWNT bundles 604 and 608 include far higher proportions of semiconducting SWNTs. Likewise, semiconducting nanotube shells of MWNTs can be effectively insulated be depleting the shells of carriers using similar methods as those for SWNTs. Thus the breakdown of a MWNT can be controlled to yield desired characteristics (e.g., metallic or semiconducting). The selective breakdown of a composite nanotube can be explained by the relative dependencies of metallic and semiconducting nanotubes on a gate voltage. The conductance of metallic nanotubes show little dependence on gate voltages, however, the conductance of semiconducting nanotubes exhibit a strong dependence on gate voltage.

Thus, as shown in FIGS. 6a and 6b, at positive gate voltages, the conductance of the SWNT approaches zero, while at negative gate voltages, the conductance increases as carriers are added. FIGS. 6a and 6b depict G(Vg) for two small SWNT ropes before and after controlled breakdown respectively. The unperturbed samples have a conductance which can be partially modulated by the gate electrode, much like the case for MWNTs. As the metallic SWNTs in the rope are destroyed, the underlying conductance G$_m$ decreases to zero. In contrast, the extent of modulation G$_s$ does not change. The measurements indicate that, by depleting the semiconducting SWNTs of carriers during the breakdown process, they can be effectively protected from damage. This result suggests little electronic interaction between different SWNTs in a rope. Measurements of changes in the temperature dependence of G(Vg) could address the issue of interactions and determine at what energy range, if any, such interactions becomes important.

Figure 6C:
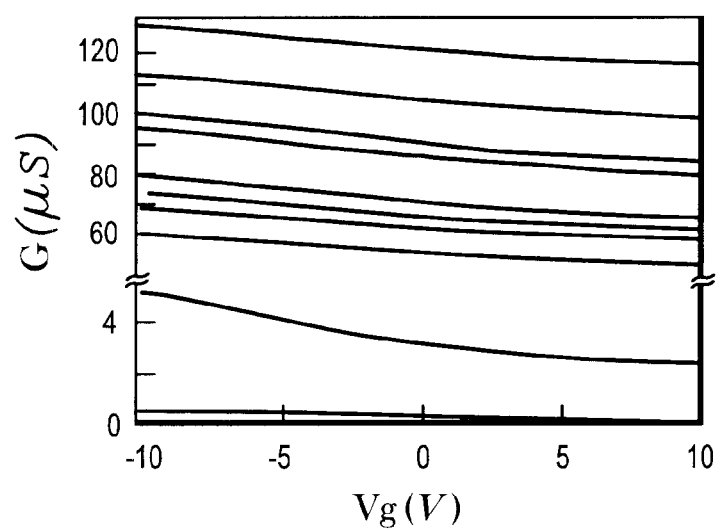

With the semiconducting SWNTs unaffected, the G(Vg) curve is rigidly shifted downwards according to the contribution of the metallic SWNTs. Referring to FIG. 6c, even for very large ropes containing hundreds of SWNTs, these samples can be effectively converted into FETs. However, in this case the gradual decrease of G$_m$ halts before it reaches zero, presumably because metallic SWNTs at the core of the rope are encased by semiconducting SWNTs. The ultimate destruction of these weakly-coupled metallic SWNTs can require higher voltages and may sacrifice some surrounding semiconducting SWNTs. As a result, a rope with many semiconducting channels and a large, initial modulation G$_s$>10 $\mu$S may only result in a FET with G$_s$~1 $\mu$S.

Besides being useful for the study of MWNTs and SWNT interactions, the controlled breakdown technique is extremely valuable for the fabrication of nanotube-based electronic devices. Until now, SWNT FETs have been fabricated individually. Typically, very low surface coverage has ensured that at most one SWNT connects a source and drain electrode at this density, most prospective circuits remain disconnected but some incorporate a metallic SWNT while others have a semiconducting SWNT.

While this technique has proven valuable for the initial characterization of SWNT properties, practical applications will need reliable generation of many devices in parallel. Achieving densely packed FETs, for example, needs purely semiconducting SWNTs at a sufficient density to interconnect all of the desired positions. The nanotubes may be provided by known techniques, such as, in-situ growth by chemical vapor deposition or grown ex-situ and deposited. High surface densities favor multiple SWNTs and SWNT ropes which, due to the variability of SWNT properties, are dominated by metallic tubes, useless as semiconducting channels. At present, no method is known to exist for the synthesis of purely semiconducting SWNTs or for the separation of semiconducting SWNTs from SWNT mixtures.

Figure 7A:
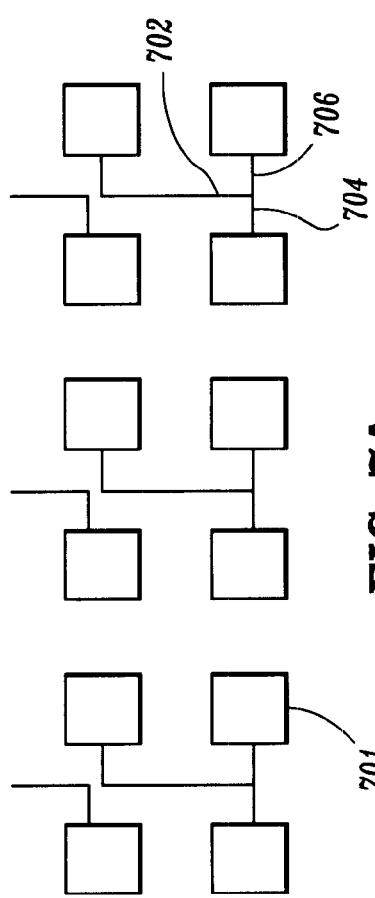
FIG. 7a is a diagram showing an array of electrodes.
Figure 7B:
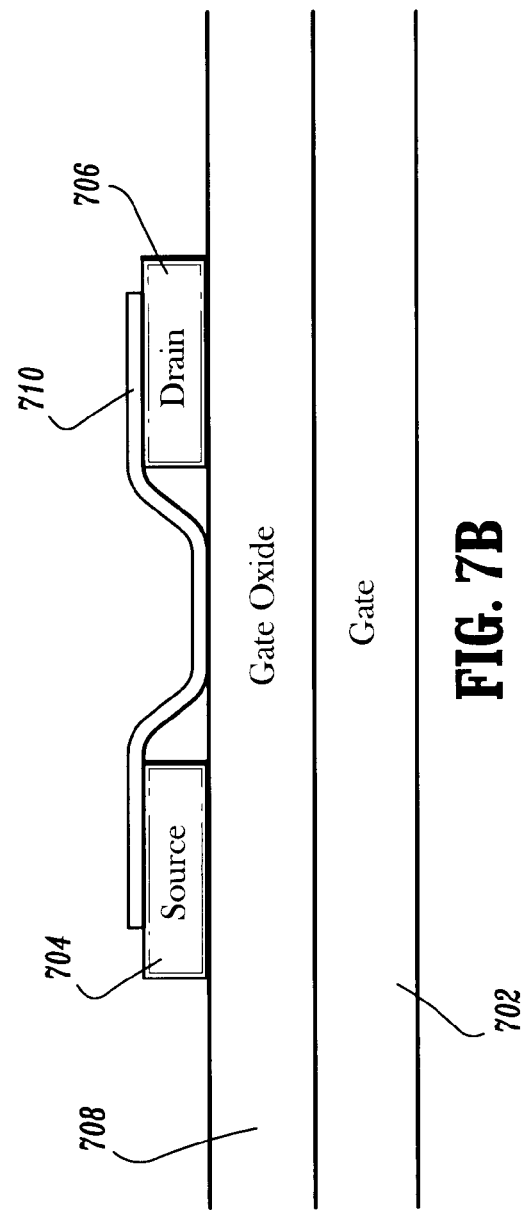
FIG. 7b is a diagram of a single-walled nanotube rope based field effect transistor including a source, drain, and gate.

Referring to FIG. 7a, showing a small array of independently addressable SWNT FETs fabricated using standard lithography. An array of metallic pads (e.g., 701) is provided, each pad includes a source 704, drain 706, or gate electrode 702. The substrate for these pads can be any insulating material, preferably silica based. The combination of substrate and metallic pads is referred to as the substrate for the nanotubes. Each FET includes a source, a drain, a gate, and at least one nanotube connecting the source and the drain. The nanotubes are provided to connect each source to a corresponding drain. Referring now to FIG. 7b, a gate oxide 708 separates the gate 702 from the electrodes (704, 706). The SWNT density can be adjusted to ensure that at least one rope (e.g., 710) shorts every set of electrodes while minimizing the unwanted connections between devices. Preferably, the density of nanotubes has no thickness, e.g., is less than a monolayer or 100% coverage. Some results have shown that densities of less than one percent are sufficient to ensure that each source-drain pair is connected by at least one nanotube, though densities as low as about 1/10th of one percent of the substrate can also provide connectivity for each source-drain pair in an array. Ropes between source and drain electrodes (e.g., 710) are converted into FETs by selective breakdown of metallic nanotubes, while stray nanotubes were removed entirely by complete breakdown.

Figure 6D:
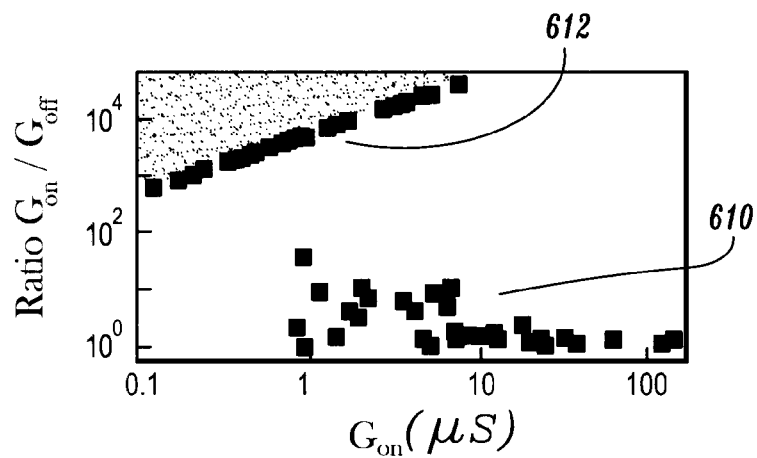

Although these ropes initially show little or no switching because of their metallic constituents, final devices with good FET characteristics can be reliably achieved as shown in FIG. 6d. Some results indicate that the generation of SWNT FETs can be achieved with greater than 90% certainty from a disordered starting material. FIG. 6d summarizes results for thirty-two devices incorporating one or more SWNT ropes. Before modification, e.g., 610, the conductance of individual ropes varies widely due to the distribution of rope sizes as well as contact effects, and very few devices can be substantially depleted by the gate.

Upon breaking the metallic SWNTs (e.g. 612), the conductance of each rope is decreased but the remaining channel is solely semiconducting and can be fully depleted. The resulting devices have reasonable FET characteristics limited primarily by contact resistance, a difficulty which is being addressed separately. Multiple, small SWNT bundles can be produced by chemical vapor growth and can alleviate the difficulties encountered with large bundles and result in FETs having excellent conductivity and switching ratios.

Although this disclosure has focused on the particular system of carbon nanotubes, the same principles may apply broadly to various molecular electronics systems. In general, arrays of molecular devices can be produced by design using external electrical means, without a need for actual control at the nanometer scale. Discretionary modification allows for the definition of useful electronic elements from a random mixture. Although this solution has been applied to solve the problem of variation inherent to carbon nanotubes, one skilled in the art would see in light of the present disclosure that similar results can be achieved using mixtures of other molecules.

Having described embodiments of a system and method for engineering carbon nanotubes and nanotube circuits using electrical breakdown, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for forming a device comprising the steps of:
providing a substrate;
providing a plurality of nanotubes in contact with the substrate; and
selectively breaking a nanotube using an electrical current.

2. The method of claim 1, further comprising the step of depleting a semiconducting nanotube of a plurality of carriers.

3. The method of claim 2, wherein the step of depleting a semiconducting nanotube of a plurality of carriers further comprises the step of applying a voltage to a gate electrode on the substrate.

4. The method of claim 3, further comprising the step of applying the electrical current through the nanotube from a source electrode to a drain electrode.

5. The method of claim 1, wherein the plurality of nanotubes are multi-walled nanotubes including metallic and semiconducting nanotubes.

6. The method of claim 5, wherein the step of selectively breaking includes breaking an outer metallic nanotube.

7. The method of claim 1, wherein the plurality of nanotubes are single-walled nanotube ropes including metallic and semiconducting nanotubes.

8. The method of claim 7, wherein the step of breaking includes breaking at least one metallic nanotube.

9. The method of claim 1, wherein the nanotubes are provided at a density between a monolayer and about 1/10th of one percent coverage.

10. The method of claim 1, wherein the substrate is an insulator and includes an array of metallic pads.

11. The method of claim 10, wherein the substrate is silica based and includes the array of metallic pads.

12. The method of claim 11, wherein each pad includes one of a source electrode, a drain electrode, and a gate electrode.

13. The method of claim 1, wherein the step of providing a substrate is accomplished using lithography to form an array of pads, each pad including a corresponding electrode on an insulating substrate.

14. The method of claim 1, wherein the nanotubes are carbon nanotubes.

15. The method of claim 1, further comprising the step of breaking a plurality of stray nanotubes.

16. A method of modifying at least one characteristic of a nanotube comprising the steps of:
providing a mixture of nanotubes; and
applying a current to the mixture, inducing the selective breakdown of the nanotube mixture.

17. The method of claim 16, further comprising the step of removing a plurality of carriers from a semiconducting nanotube.

18. The method of claim 17, wherein the current selectively breaks metallic nanotubes.

19. The method of claim 18, wherein power applied to the mixture is about 500 $\mu$W.

20. The method of claim 16, wherein the nanotube is one of a multi-walled nanotube and a single-walled nanotube rope.

21. The method of claim 16, wherein the characteristic is one of diameter, density, and conductance.

22. The method of claim 16, wherein the mixture includes metallic and semiconducting nanotubes.

23. The method of claim 16, wherein the current density is greater than $10^9$ A/cm$^2$.

24. A method for forming a device comprising the steps of:

providing an insulating substrate including a source electrode, a drain electrode, and a gate electrode;

providing a plurality of carbon nanotube bundles including metallic and semiconducting component nanotubes in contact with the substrate, wherein the nanotubes are provided at a density of about one percent coverage;

applying a voltage to the gate electrode to deplete the semiconducting component nanotubes of a plurality of carriers;

applying an electrical current through the nanotube, from a source electrode to a drain electrode; and breaking at least one metallic component nanotube to form a field effect transistor.

25. The method of claim 24, wherein the carbon nanotube bundle is one of a multi-walled nanotube and a single-walled nanotube rope.

* * * * *